United States Patent
Tai et al.

(10) Patent No.: US 7,274,246 B2
(45) Date of Patent: Sep. 25, 2007

(54) SWITCHING CIRCUIT USING MULTIPLE COMMON-DRAIN JFETS FOR GOOD HEAT DISSIPATION CAPABILITY AND SMALL PCB LAYOUT AREA

(75) Inventors: Liang-Pin Tai, Tainan (TW);
Jiun-Chiang Chen, Houli Township, Taichung County (TW)

(73) Assignee: Richtek Technology Corp., Hsinchu (TW)

( * ) Notice: Subject to any disclaimer, the term of this patent is extended or adjusted under 35 U.S.C. 154(b) by 65 days.

(21) Appl. No.: 11/159,245

(22) Filed: Jun. 23, 2005

(65) Prior Publication Data
US 2005/0285118 A1    Dec. 29, 2005

(30) Foreign Application Priority Data
Jun. 24, 2004    (TW) ............... 93118350 A

(51) Int. Cl.
*H03K 17/687* (2006.01)

(52) U.S. Cl. .................. 327/430; 327/431

(58) Field of Classification Search ........... 327/430, 327/431
See application file for complete search history.

(56) References Cited

U.S. PATENT DOCUMENTS

| | | | | |
|---|---|---|---|---|
| 4,896,061 A | * | 1/1990 | Ahmed ............... | 327/431 |
| 4,947,064 A | * | 8/1990 | Kim et al. .......... | 327/262 |
| 5,223,754 A | * | 6/1993 | Decker et al. ...... | 327/434 |
| 5,497,118 A | * | 3/1996 | Ueno et al. ........ | 327/416 |

\* cited by examiner

*Primary Examiner*—Kenneth B. Wells
(74) *Attorney, Agent, or Firm*—Rosenberg, Klein & Lee

(57) ABSTRACT

A switching circuit uses multiple common-drain JFETs to serve as the low-side switches of the switching circuit, and each of the low-side JFET is coupled between a high-side switch and a power node. Since a JFET can endure high voltage at both drain side and source side, and has good heat dissipation capability at drain side, the drain of the low-side JFET is coupled to the power node to enhance the heat dissipation capability and accordingly, all the low-side JFETs are allowed to be packaged in a same package to reduce the PCB layout area.

2 Claims, 6 Drawing Sheets

US 7,274,246 B2

SWITCHING CIRCUIT USING MULTIPLE COMMON-DRAIN JFETS FOR GOOD HEAT DISSIPATION CAPABILITY AND SMALL PCB LAYOUT AREA

FIELD OF THE INVENTION

The present invention is related generally to a switching circuit for a DC-to-DC converter and more particularly to a switching circuit having good heat dissipation capability and small PCB layout area.

BACKGROUND OF THE INVENTION

DC-to-DC converters have been widely applied in various electronic circuits, with high-side and low-side switches in a switching circuit controlled by a control circuit to generate a stable output voltage for a supply voltage to its load circuit. FIG. 1 shows a circuit diagram of a conventional switching circuit 10 for an N-phase DC-to-DC converter, which comprises N power stages 12 coupled in parallel between two power nodes, i.e., power supply Vin and ground GND, and each of them including a Metal-Oxide-Semiconductor Field-Effect Transistor (MOSFET) 122 serving as the high-side switch coupled between the input voltage Vi and a phase node PHASEn and a MOSFET 124 serving as the low-side switch coupled between the phase node PHASEn and ground GND, and the MOSFETs 122 and 124 are switched by control signals UGn and LGn at their gates 1226 and 1246, respectively, to regulate a current ILn flowing through an inductor Ln to charge a capacitor Co to produce the output voltage Vout of the converter, where n=1, 2, 3, ..., N. FIG. 2 shows a connection layout on a printed circuit board (PCB) for the MOSFETs 122 and 124 of one power stage 12, on which the metal strips are designated with the respective element numerals of the circuit 10 to be bonded thereon. In a PCB, the power nodes of input voltage Vin and ground GND have large metal planes (not shown in FIG. 2), and thus they may enhance heat dissipation. The phase node 126 has a small metal plane since it is a signal node, and it almost does nothing for heat dissipation. A MOSFET can endure high voltage and has good capability to dissipate heat at the drain side, but cannot endure high voltage and has poor capability to dissipate heat at the source side. Therefore, the high-side MOSFET 122 can dissipate heat to the power node Vin through its drain side, and thus it has good heat dissipation capability. The low-side MOSFET 124 can dissipate heat to the power node GND through its source side, but the heat dissipation capability is poor at the source side. To prevent the low-side MOSFET 124 from overheated to result in improper operations, all the low-side MOSFETs 124 of the switching circuit 10 are individually packaged one by one, and thus they will occupy large PCB layout area.

Therefore, a switching circuit having good heat dissipation capability and small PCB layout area is desired.

SUMMARY OF THE INVENTION

One object of the present invention is to provide a switching circuit having good heat dissipation capability and small PCB layout area.

Another object of the present invention is to provide a switching circuit using multiple common-drain Junction Field-Effect Transistors (JFETs) as the switches for a DC-to-DC converter.

A switching circuit according to the present invention comprises a plurality of first common-drain JFETs and a plurality of second common-drain JFETs arranged in such a manner that the drains of the first and second JFETs are coupled to a first and second power nodes, respectively, and each of the second JFETs has its source coupled to the source of a respective one of the first JFETs through a respective phase node.

Alternatively, a switching circuit according to the present invention comprises a plurality of common-drain MOSFETs and a plurality of common-drain JFETs arranged in such a manner that the drains of the MOSFETs and JFETs are coupled to a first and second power nodes, respectively, and each of the JFETs has its source coupled to the source of a respective one of the MOSFETs through a respective phase node.

Since a JFET can endure high voltage at both drain side and source side, and has good heat dissipation capability at drain side, coupling the drain of a JFET in a switching circuit to a power node will enhance the heat dissipation of the switching circuit, and accordingly, several JFETs of the switching circuit are allowed to be packaged in a same package to reduce the PCB layout area.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
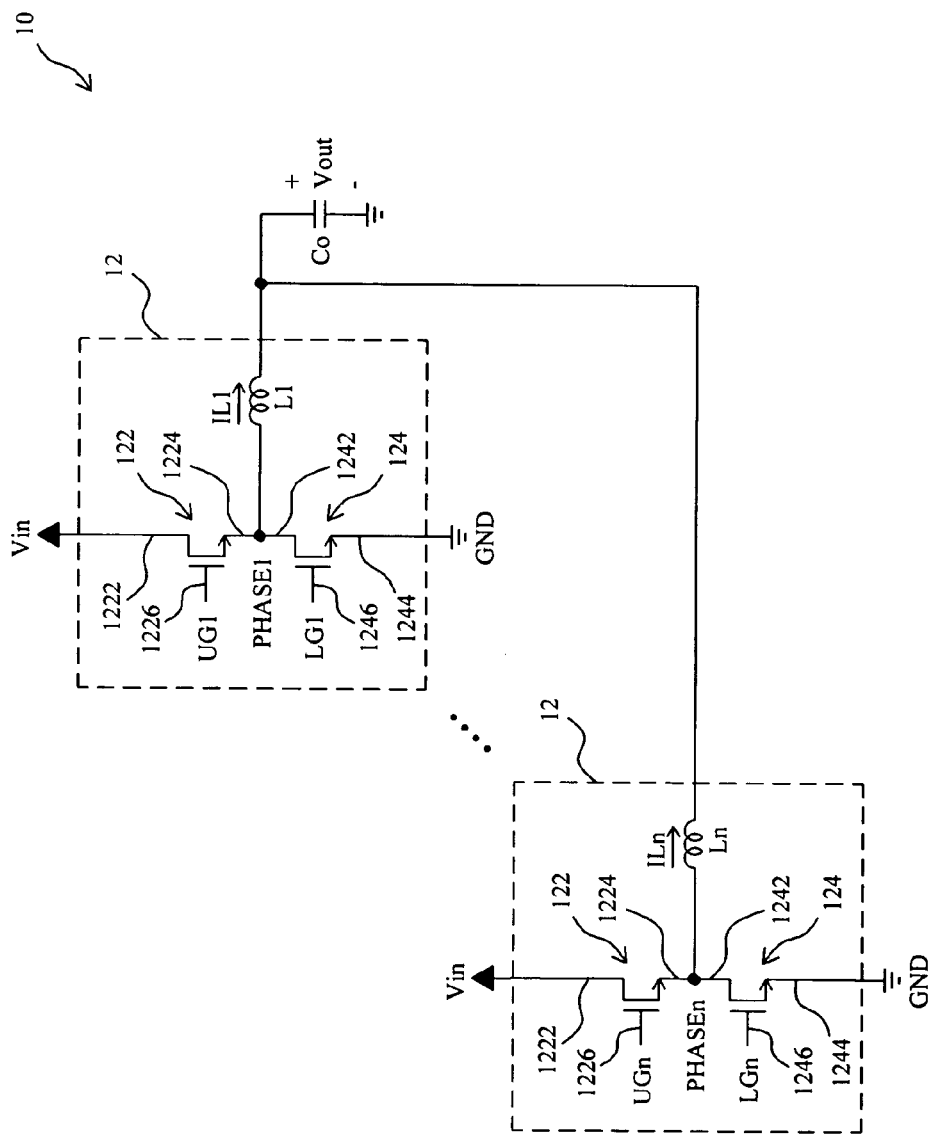
FIG. 1 shows a circuit diagram of a conventional switching circuit for an N-phase DC-to-DC converter.
Figure 2:
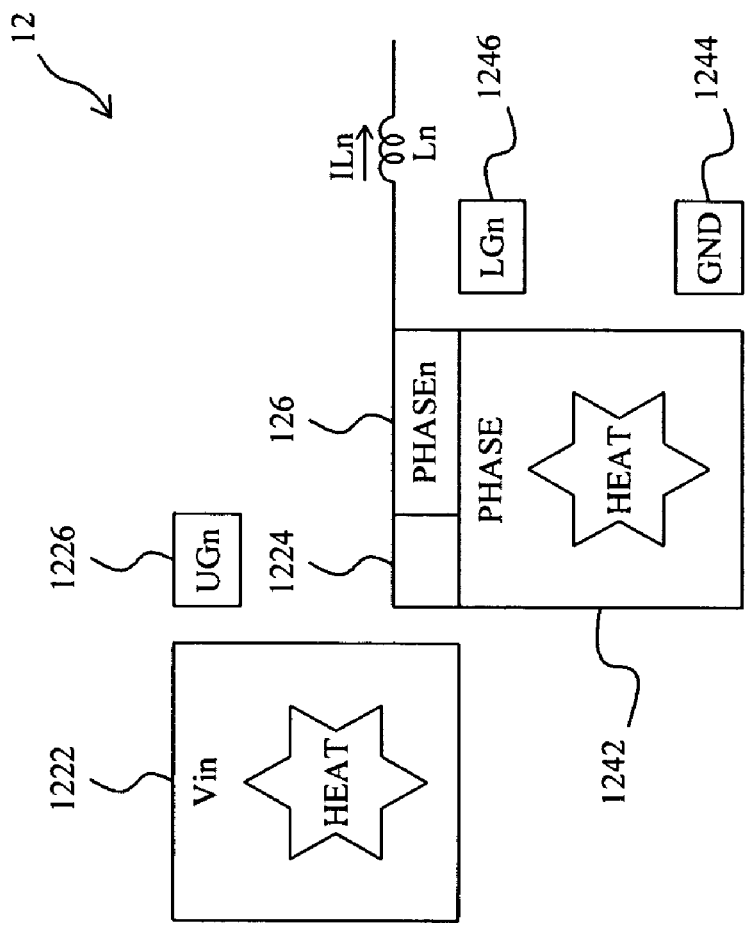
FIG. 2 shows a connection layout on a PCB for the high-side and low-side MOSFETs of one power stage shown in FIG. 1.
Figure 3:
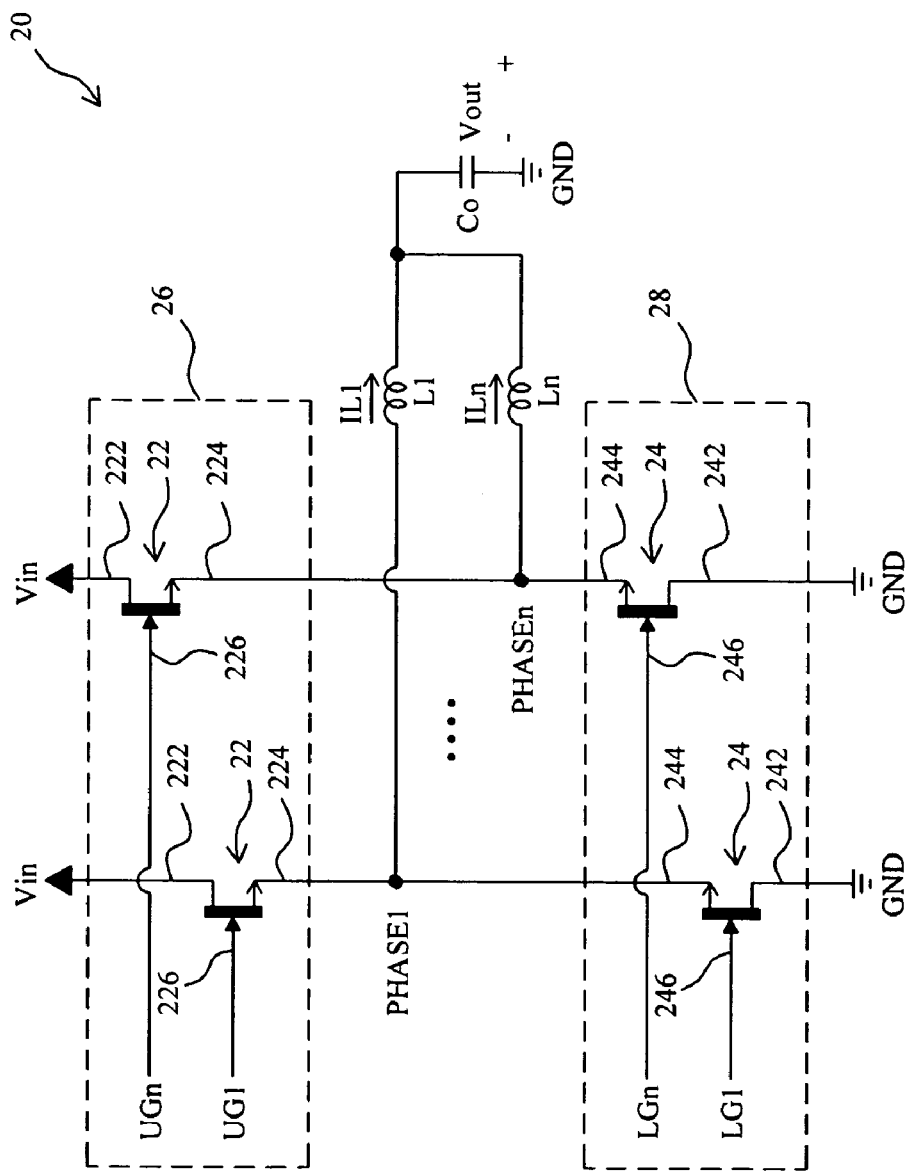
FIG. 3 shows a circuit diagram of a first embodiment of a switching circuit according to the present invention.

FIG. 3 shows a circuit diagram of a switching circuit 20 for an N-phase DC-to-DC converter according to the present invention, which comprises N common-drain high-side JFETs 22 each coupled between the input voltage Vin and a phase node PHASEn and N common-drain low-side JFETs 24 each coupled between the phase node PHASEn and ground GND, where n=1, 2, 3 ..., N. The common-drain high-side JFETs 22 are packaged in a same package 26, and have their drains 222 coupled to the power node Vin. The common-drain low-side JFETs 24 are packaged in a same package 28, and have their drains 242 coupled to the power node GND. For any phase n, the high-side JFET 22 and low-side JFET 24 are alternatively switched by control signals UGn and LGn at their gates 226 and 246, respectively, to regulate a current ILn flowing through an inductor Ln to charge a capacitor Co to produce the output voltage Vout of the converter. Since a JFET can endure high voltage at both its drain side and source side, and has good heat dissipation capability at the drain side, the drain 242 of the low-side JFET 24 is coupled to the power node GND for good heat dissipation capability, and the source 244 is coupled to the phase node PHASEn. The heat generated in the low-side JFET 24 is then dissipated to the power node GND through the drain 242 and therefore rapidly dissipated by the large metal plane of the power node GND. As a result, the heat dissipation capability of the switching circuit 20 is improved, and accordingly, all the low-side JEETs 24 of the switching circuit 20 are allowed to be packaged in the single package 28 to reduce the PCB layout area.

Figure 4:
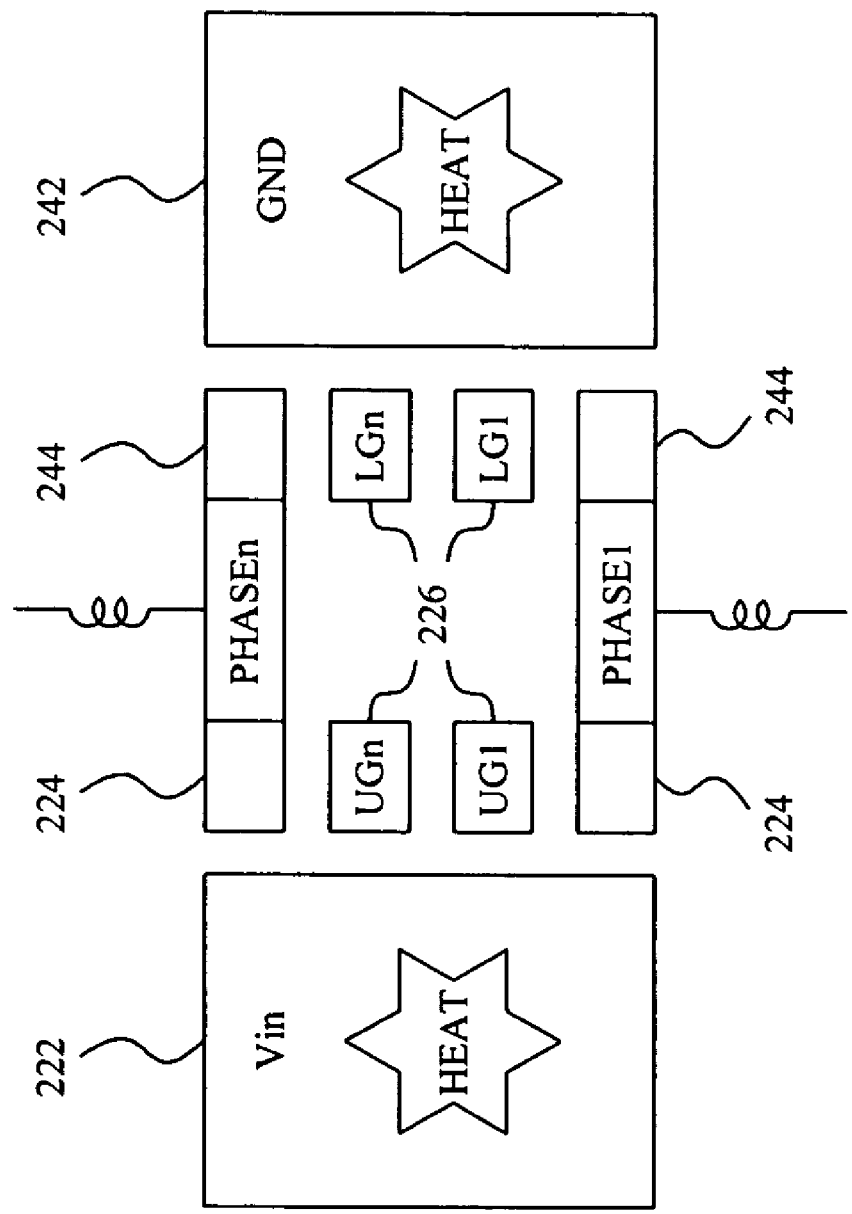
FIG. 4 shows a connection layout on a PCB for the high-side and low-side JFETs of the switching circuit shown in FIG. 3.

FIG. 4 shows a connection layout on a PCB for the packages 26 and 28 of the switching circuit 20 shown in FIG. 3, on which the metal strips are designated with the respective element numerals of the circuit 20 to be bonded thereon. The drain 222 of the multiple common-drain high-side JFETs 22 is coupled to the power node Vin and therefore, the heat generated in the high-side JFETs 22 is dissipated to the power node Vin through the drain 222 and rapidly dissipated by the large metal plane of the power node Vin (not shown in FIG. 4). Similarly, the drain 242 of the multiple common-drain low-side JFETs 24 is coupled to the power node GND and therefore, the heat generated in the low-side JFET 24 is dissipated to the power node GND through the drain 242 and rapidly dissipated by the large metal plane of the power node GND (not shown in FIG. 4).

Figure 5:
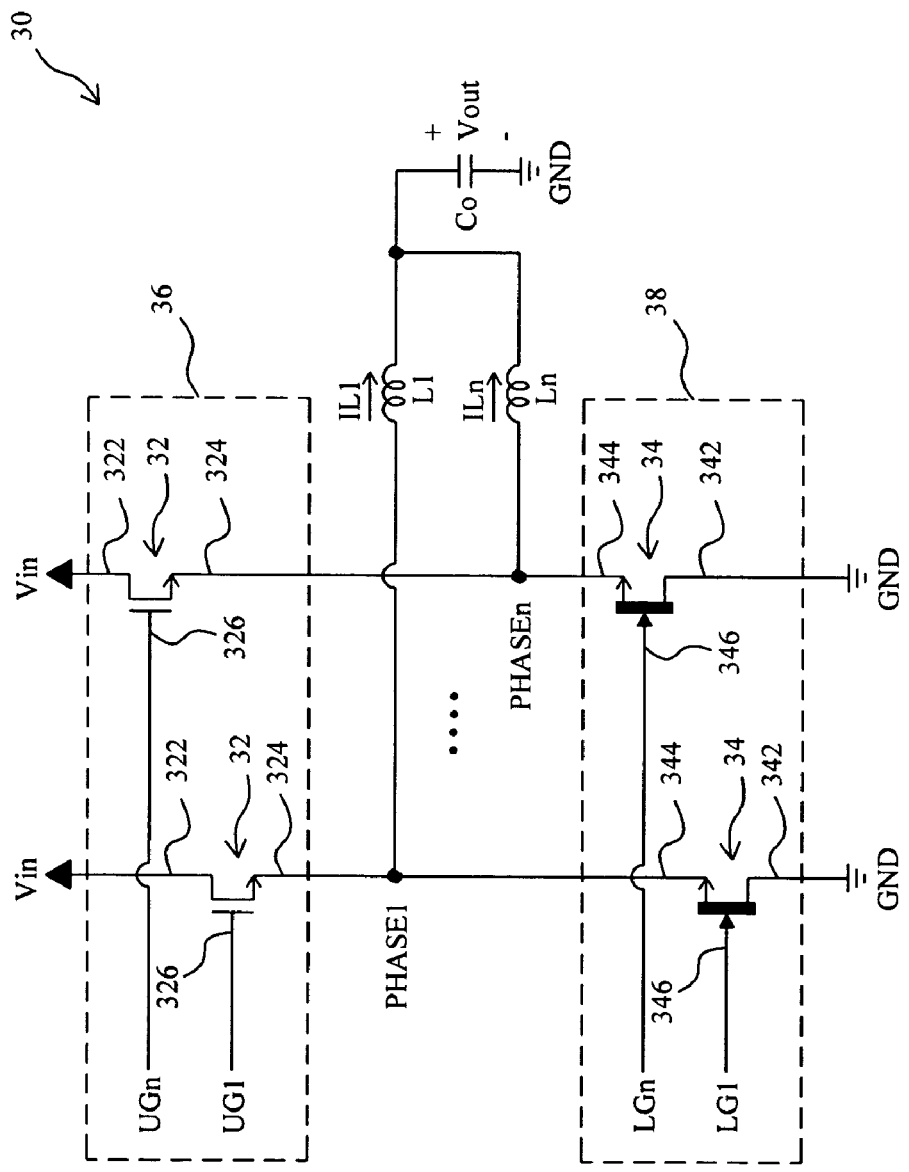
FIG. 5 shows a circuit diagram of a second embodiment of a switching circuit according to the present invention.

FIG. 5 shows a circuit diagram of another switching circuit 30 for an N-phase DC-to-DC converter according to the present invention, which comprises N common-drain high-side MOSFETs 32 each coupled between the input voltage Vin and a phase node PHASEn and N common-drain low-side JFETs 34 each coupled between the phase node PHASEn and ground GND, where n=1, 2, 3 . . . , N. The common-drain high-side MOSFETs 32 are packaged in a same package 36, and have their drains 322 coupled to the power node Vin. The common-drain low-side JFETs 34 are packaged in a same package 38, and have their drains 342 coupled to the power node GND. For any phase n, the high-side MOSFET 32 and low-side JFET 34 are alternatively switched by control signals UGn and LGn at their gates 326 and 346, respectively, to regulate a current ILn flowing through an inductor Ln to charge a capacitor Co to produce the output voltage Vout of the converter. Since a JFET can endure high voltage at both drain side and source side, and has good heat dissipation capability at drain side, the drain 342 of the low-side JFET 34 is coupled to the power node GND for good heat dissipation capability, and the source 344 is coupled to the phase node PHASEn, such that the heat generated in the low-side JFET 34 is dissipated to the power node GND through the drain 342 and therefore rapidly dissipated by the large metal plane of the power node GND. As a result, the heat dissipation capability of the switching circuit 30 is improved, and accordingly, all the low-side JFETs 34 of the switching circuit 30 are allowed to be packaged in the single package 38 to reduce the PCB layout area.

Figure 6:
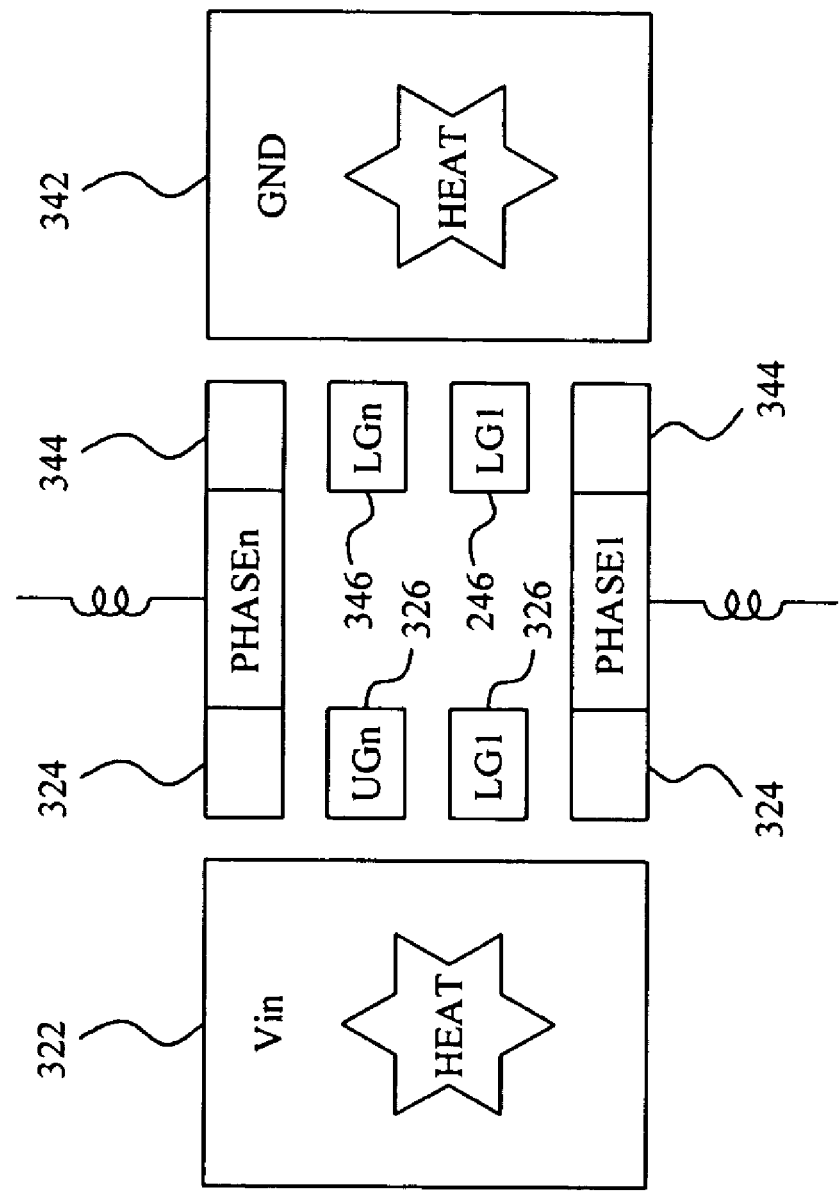
FIG. 6 shows a connection layout on a PCB for the high-side MOSFETs and low-side JFETs of the switching circuit shown in FIG. 5.

FIG. 6 shows a connection layout on a PCB for the packages 36 and 38 of the switching circuit 30 shown in FIG. 5, on which the metal strips are designated with the respective element numerals of the circuit 30 to be bonded thereon. The drain 322 of the multiple common-drain high-side MOSFETs 32 is coupled to the power node Vin and therefore, the heat generated in the high-side MOSFETs 32 is dissipated to the power node Vin through the drain 322 and rapidly dissipated by the large metal plane of the power node Vin (not shown in FIG. 6). On the other hand, the drain 342 of the multiple common-drain low-side JFETs 34 is coupled to the power node GND and therefore, the heat generated in the low-side JFET 34 is dissipated to the power node GND through the drain 342 and rapidly dissipated by the large metal plane of the power node GND (not shown in FIG. 6).

By using multiple common-drain JFETs for the low-side switches in a switching circuit with the drain coupled to a power node, the heat generated in the low-side switches is enhanced to be dissipated by the large metal plane of the power node, and the switching circuit has good heat dissipation capability and small PCB layout area accordingly.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A switching circuit comprising:
   a plurality of common-drain MOSFETs having their drains coupled to a first power node; and
   a plurality of common-drain JFETs having their drains coupled to a second power node, each of the plurality of JFETs having a source coupled to a source of a respective one of the plurality of MOSFETs.

2. The switching circuit of claim 1, wherein the plurality of JFETs are packaged in a common package.

* * * * *